United States Patent
Lee et al.

(10) Patent No.: US 7,610,439 B2
(45) Date of Patent: Oct. 27, 2009

(54) METHOD AND SYSTEM FOR HARDWARE IMPLEMENTATION OF RESETTING AN EXTERNAL TWO-WIRED EEPROM

(75) Inventors: Jonathan F. Lee, Dublin, CA (US); Xiaogang Zhu, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 432 days.

(21) Appl. No.: 11/673,348

(22) Filed: Feb. 9, 2007

(65) Prior Publication Data
US 2008/0195883 A1 Aug. 14, 2008

(51) Int. Cl.
*G06F 1/04* (2006.01)
(52) U.S. Cl. .................................... 711/103
(58) Field of Classification Search ........................ None
See application file for complete search history.

(56) References Cited
U.S. PATENT DOCUMENTS

| | | | |
|---|---|---|---|
| 6,765,543 B1 * | 7/2004 | Masuda et al. | 345/1.1 |
| 6,798,434 B2 * | 9/2004 | Shibata et al. | 347/214 |
| 6,829,003 B2 * | 12/2004 | Takami | 348/76 |
| 2001/0048466 A1 * | 12/2001 | Takami | 348/65 |
| 2003/0184642 A1 * | 10/2003 | Shibata et al. | 347/214 |
| 2004/0233189 A1 * | 11/2004 | Masuda et al. | 345/204 |

* cited by examiner

*Primary Examiner*—Kevin Verbrugge
(74) *Attorney, Agent, or Firm*—McAndrews Held & Malloy, Ltd.

(57) ABSTRACT

Methods and systems for hardware controlling of an electrically erasable programmable read only memory (EEPROM) are described herein. Aspects of the invention may include generating a clock signal at a frequency suitable for EEPROM operation and resetting an EEPROM utilizing the generated clock signal and a hardware generated data signal without intervention from a central processing unit (CPU). The resetting may occur via a virtual CPU. Another aspect of the invention may have the signal generation and EEPROM resetting occurring via a virtual CPU integrated within a finite state machine. A frequency counter may be utilized to generate a clock signal from a clock source having a higher frequency than that required by the EEPROM.

23 Claims, 5 Drawing Sheets

METHOD AND SYSTEM FOR HARDWARE IMPLEMENTATION OF RESETTING AN EXTERNAL TWO-WIRED EEPROM

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to resetting EEPROM devices. More specifically, certain embodiments of the invention relate to a method and system for a hardware implementation of resetting an external two-wired EEPROM.

BACKGROUND OF THE INVENTION

An electrically erasable programmable read only memory (EEPROM) is a memory device that is used in many applications where limited amounts of non-volatile storage is needed. They can be found in many applications such as analog/digital television, set-top boxes, video equipment, games, audio systems, programmable controllers in a manufacturing setting, printers, graphics cards, and computer motherboards, to name a few.

In actuality, EEPROMs are not strictly read only memory, but are actually a hybrid between read only memory (ROM) and random access memory (RAM), since they can be programmed, erased, and reprogrammed. Other types of memory are ROM, which were originally hardwired devices with preprogrammed data. Programmable ROM (PROM) was the next advancement in that the devices were purchased unprogrammed, but could be programmed utilizing a device programmer. The device programmer would write data to the PROM, but the devices would not be erasable. Once PROMs were written, they would have to be discarded if the data needed to be changed.

EPROMs eliminated this problem in that they can be programmed and erased multiple times. However, to erase the data, the device must be removed and exposed to an intense ultraviolet (UV) light, which would restore the device to its original unprogrammed state.

EEPROMs are programmable and erasable like EPROMS, but are erased electrically. EEPROMS have continued to replace UV EPROMS in many applications as they do not require UV light or need to be removed from the system to be erased. EEPROMS are erased electrically by applying an electric field at the floating gate in the cell. EEPROMS can be erased on an individual byte basis in comparison to flash EPROMS, which must be erased by array or sector.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a hardware implementation of resetting an external two-wired EEPROM, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for controlling an electrically erasable programmable read only memory (EEPROM). Exemplary aspects of the invention may include generating a clock signal at a frequency suitable for EEPROM operation and resetting an EEPROM utilizing the generated clock signal and a hardware generated data signal without intervention from a central processing unit (CPU). The resetting may occur via a virtual CPU. Another aspect of the invention may have the signal generation and EEPROM resetting occurring via a virtual CPU integrated within a finite state machine. A frequency counter may be utilized to generate a clock signal from a clock source having a higher frequency than that required by the EEPROM.

Figure 1:
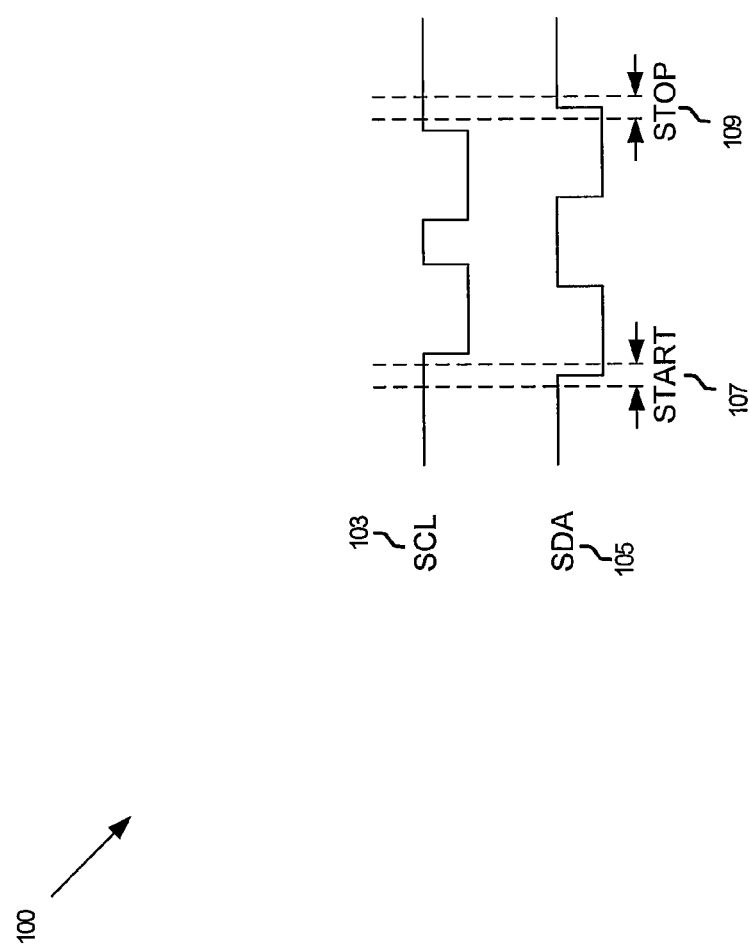
FIG. 1 is a diagram illustrating exemplary start and stop signal configurations for an EEPROM in connection with an embodiment of the invention.

FIG. 1 is a diagram illustrating exemplary start and stop signal configurations for an EEPROM in connection with an embodiment of the invention. Referring to FIG. 1, there is shown a clock signal SCL 103, a data signal, SDA 105, a Start condition 107 and a Stop condition 109. The clock signal 103 may be utilized to determine whether an EEPROM may read or write data, such as when the clock signal 103 is low, or whether an EEPROM may accept commands, such as Start condition 107 or Stop condition 109, when the clock signal 103 is high.

In operation, the Start condition 107 may comprise a transition from high to low on SDA 105 with a high signal on SCL 103. The Start condition may be utilized to start an EEPROM, and may precede any other command to the EEPROM. The Stop condition 109 may comprise a transition from low to high on SDA 105 with a high signal on SCL 103. The Stop condition 109 may be utilized to stop an EEPROM and may place the EEPROM into a standby mode.

Figure 2:
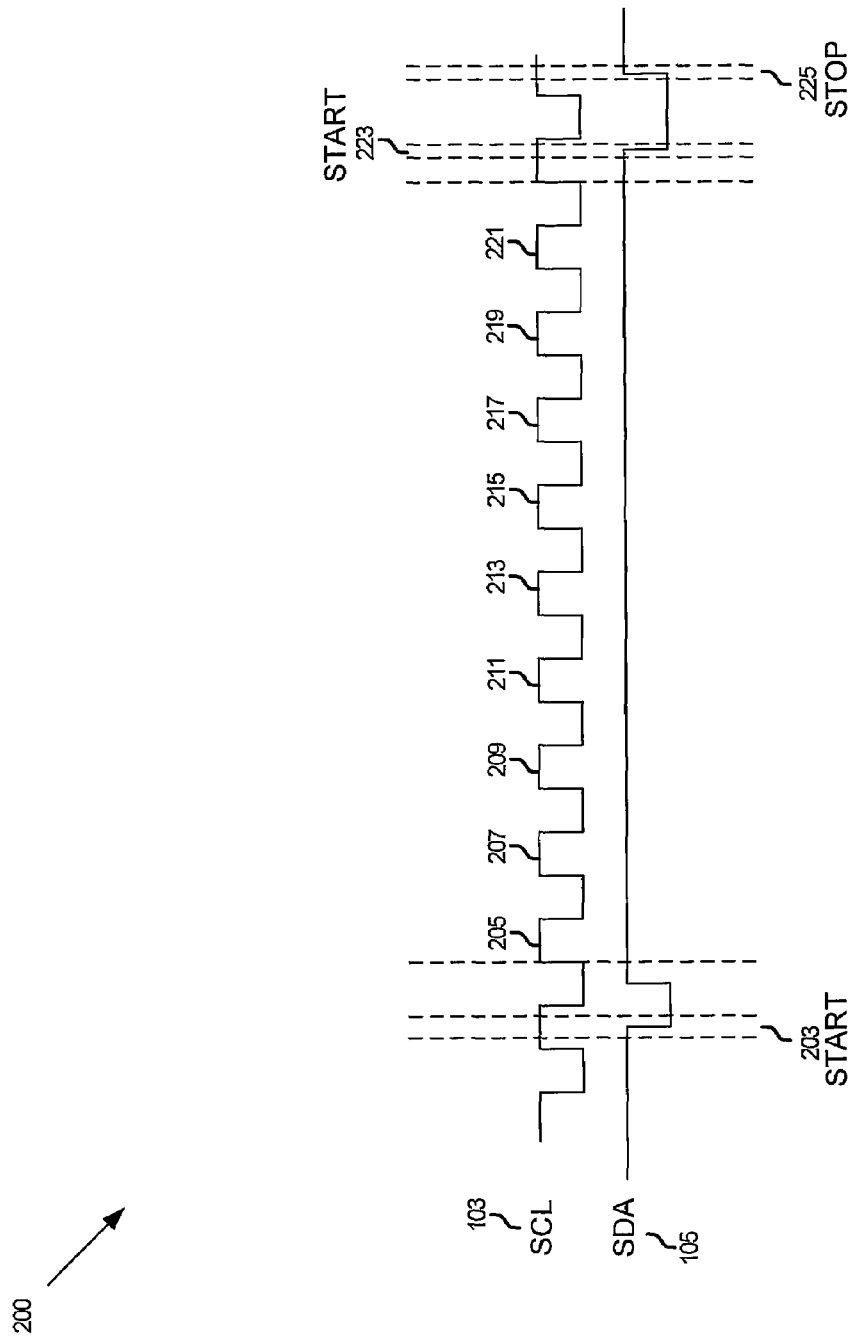
FIG. 2 is a diagram illustrating an exemplary reset configuration for an EEPROM in connection with an embodiment of the invention.

FIG. 2 is a diagram illustrating an exemplary reset configuration for an EEPROM in connection with an embodiment of the invention. Referring to FIG. 2, there is shown a clock signal, SCL 103, a data signal, SDA 105, Start conditions 203 and 223 which may be substantially similar to Start condition 107 described previously with respect to FIG. 1. Also shown in FIG. 1, following Start condition 107 are nine clock cycles 205, 207, 209, 211, 213, 215, 217, 219 and 221, and Stop condition 225, which may be substantially similar to Stop condition 109 described previously with respect to FIG. 1.

In operation, the reset configuration may be enabled by a Start condition 203, followed by, for example, nine clock cycles 205, 207, 209, 211, 213, 215, 217, 219 and 221 with SDA 105 high, another Start condition 223, and a Stop condition 225. An EEPROM reset may be activated when one of the following occurs: an interruption to the EEPROM access protocol, including read or write, a loss of power, system reset, or startup of the EEPROM operation.

Figure 3:
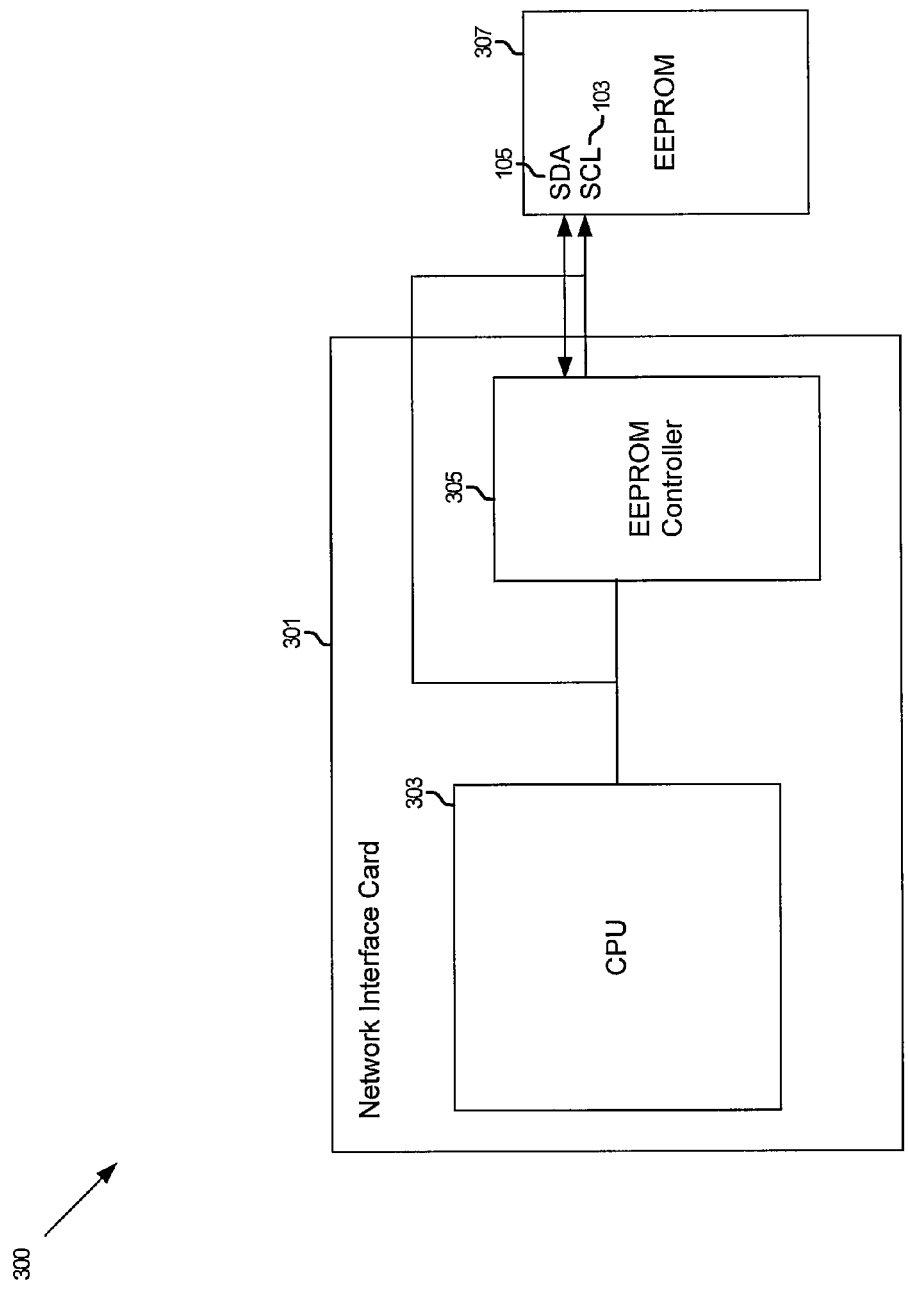
FIG. 3 is a block diagram of an exemplary CPU-based EEPROM control system in connection with an embodiment of the invention.

FIG. 3 is a block diagram of an exemplary CPU-based EEPROM control system in connection with an embodiment of the invention. The CPU-based hardware reset system 300 comprises a network interface card (NIC) 301, a host central processing unit (CPU) 303, EEPROM controller 305, and EEPROM 307. The EEPROM controller 305 may comprise suitable logic, circuitry, and/or code that may be adapted to send and receive signals to the EEPROM 307. The input signals to the EEPROM may be SCL 103 and SDA 105. The CPU 303 may be coupled to the EEPROM controller 305. In addition, the CPU 303 may be directly coupled to the EEPROM 307, bypassing the EEPROM controller.

In operation, the CPU 303 may send and/or receive signals to and/or from the EEPROM 307 via the EEPROM controller 305 through lines SDA 105 and SCL 103. The SCL 103 may be the clock signal for the EEPROM 307 and the SDA 105 may be the serial data line. Data may be read from the EEPROM when the clock signal SCL is low. Transitions in the data line SDA 105 while the clock signal SCL 103 is high may function as start or stop conditions to the EEPROM.

The CPU 303 clock speed may be greater than an operating frequency of the EEPROM 307. Thus, internal software in CPU 303 may count clock signals to step the frequency down to a suitable level for the EEPROM 307. In addition, the waveform for the EEPROM reset may be, for example, ten cycles long, which along with the reduced frequency of operation of EEPROM 307, may require significant CPU utilization.

Figure 4:
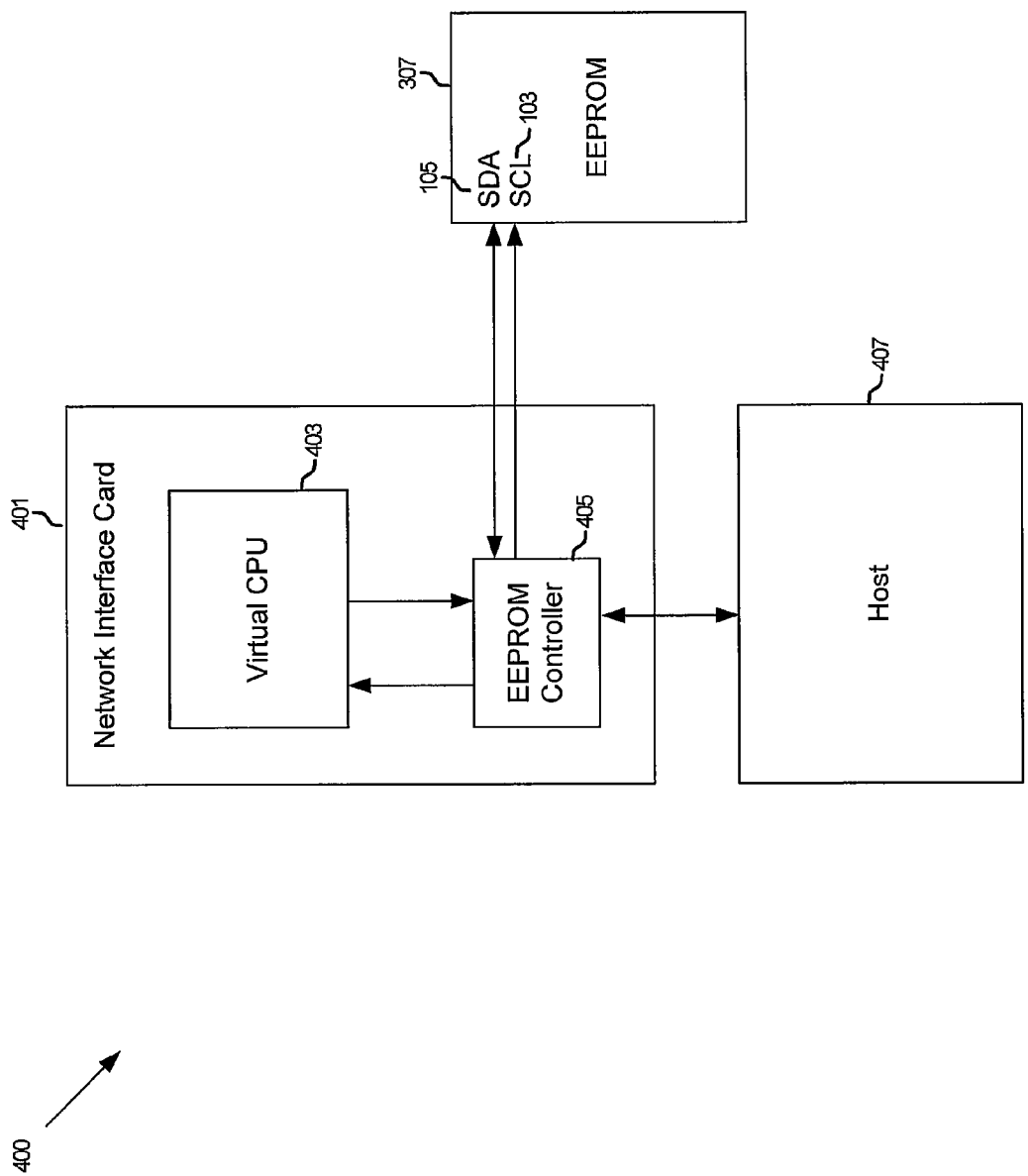
FIG. 4 is a block diagram of an exemplary EEPROM virtual CPU reset system in accordance with an embodiment of the invention.

FIG. 4 is a block diagram of an exemplary EEPROM virtual CPU reset system, in accordance with an embodiment of the invention. Referring to FIG. 4, the EEPROM control system 400 may comprise a network interface card 401, a host 407, and an EEPROM 307. The network interface card 401 may comprise a virtual CPU 403 and an EEPROM controller 405. The EEPROM controller 405 may comprise suitable circuitry, logic, and/or code that may be adapted to send and receive signals from the EEPROM 307. The virtual CPU 403 may comprise suitable circuitry, logic, and/or code that may be adapted to perform the functions of a CPU, but without the dedicated hardware necessary for a CPU core. The virtual CPU may be implemented as a finite state machine (FSM). The functions performed by the virtual CPU 403 may be specifically enabled to control operation of the EEPROM 307, which may eliminate the need for a CPU in resetting the EEPROM 307.

The virtual CPU 403 may be coupled to the EEPROM controller 405, and the EEPROM controller 405 may be coupled to the host 407 and to the EEPROM 307. The virtual CPU 403 may contain the EEPROM reset capability, freeing up a CPU in the host from this task.

In operation, the host 407 may access the EEPROM 307 via EEPROM controller 405. The EEPROM 307 may contain exemplary data such as boot code information, application data, and vital production data such as version code, control data and date code. In instances after a system reset, loss of power, an interruption in EEPROM read/write access, or at the start of EEPROM operation, an EEPROM reset may be necessary. The virtual CPU 403 enables the reset of the EEPROM 307 through EEPROM controller 405. This may be accomplished by supplying reset signals to the clock SCL 103 and data SDA 105 lines.

Figure 5:
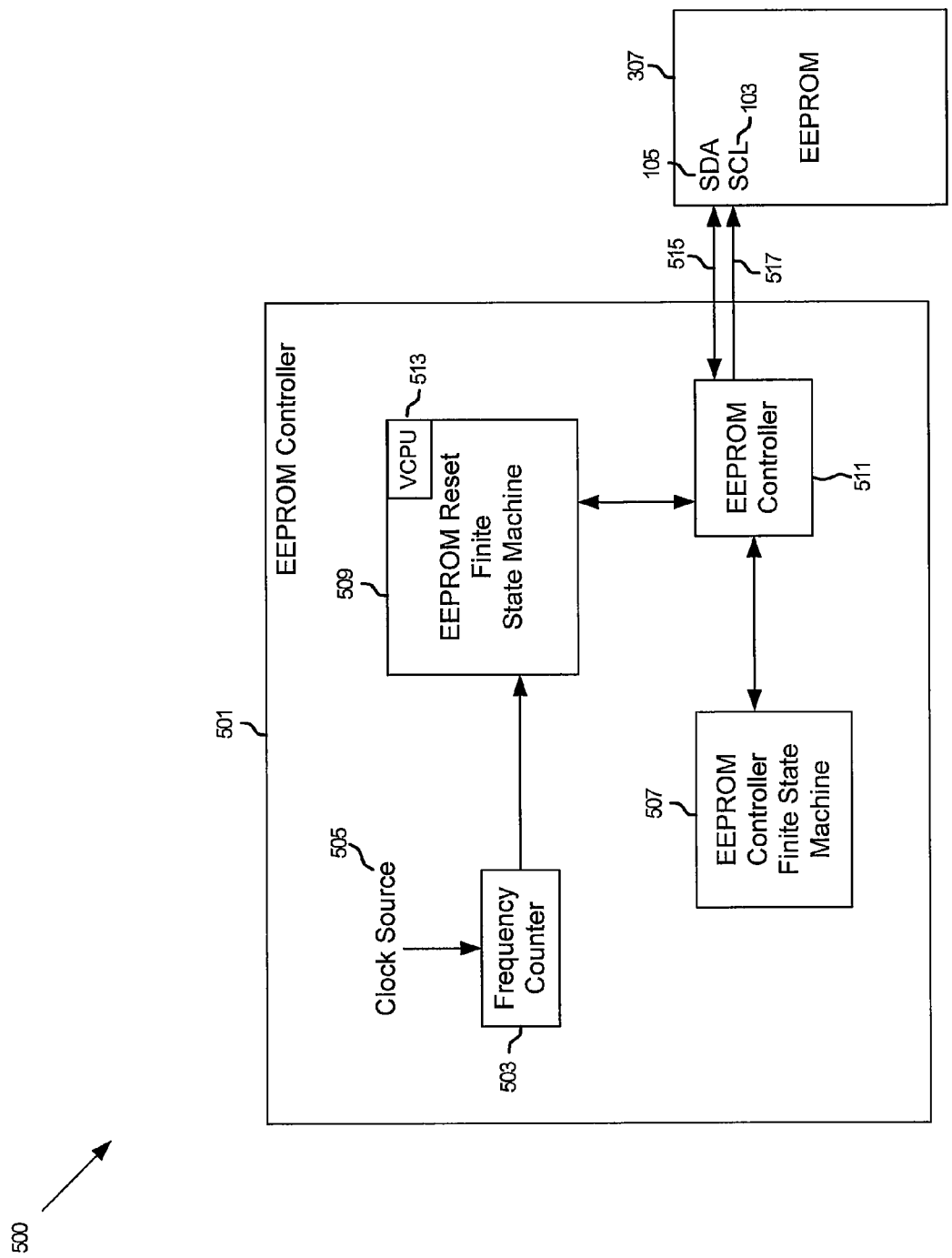
FIG. 5 is a block diagram of an exemplary finite state machine EEPROM hardware reset system in accordance with an embodiment of the invention.

FIG. 5 is a block diagram of an exemplary finite state machine EEPROM hardware reset system in accordance with an embodiment of the invention. Referring to FIG. 5, the EEPROM reset system 500 may comprise an EEPROM controller chip 501 and an EEPROM 307. The EEPROM controller chip 501 may comprise a frequency counter 505, an EEPROM reset finite state machine (FSM) 509 with integrated virtual CPU 512, an EEPROM controller FSM 507, and an EEPROM controller 511. The frequency counter 503 may comprise suitable circuitry, logic, and/or code that may be adapted to generate a frequency suitable for EEPROM operation from an input clock source 505. The EEPROM reset FSM 509 may comprise suitable circuitry, logic, and/or code that may be adapted to generate signals that may be utilized to reset the EEPROM 307. The EEPROM controller 511 may comprise suitable circuitry, logic, and/or code that may be adapted to send and receive signals from the EEPROM 307.

The frequency counter 505 may be coupled to the EEPROM reset FSM 509 which may include an integrated virtual CPU 513. The EEPROM reset FSM 509 may be coupled to the EEPROM controller 511. The EEPROM controller FSM 507 may also be coupled to the EEPROM controller 511. The EEPROM controller 511 may then be coupled to the EEPROM 302 through lines SDA 105 and SDL 103.

The EEPROM reset FSM may reset the EEPROM 307 via the EEPROM controller 511. The EEPROM controller FSM 507 may perform various other functions in interacting with the EEPROM not related to resetting, which may comprise enabling start or stop conditions, data read/write acknowledge, or standby mode.

Certain embodiments of the invention may comprise a method, system, and machine-readable code for controlling an electrically erasable programmable read only memory (EEPROM). Aspects of the invention may comprise generating a clock signal at a frequency suitable for EEPROM 307 operation and resetting an EEPROM 307 utilizing the generated clock signal 103 and a hardware generated data signal 105 without intervention from a central processing unit (CPU) 303. The resetting may occur via a virtual CPU 403. Another aspect of the invention may have the signal generation and EEPROM resetting occurring via a virtual CPU 513 integrated within a finite state machine 509. A frequency counter 503 may be utilized to generate a clock signal from a clock source 505 having a frequency that may be greater than that required by the EEPROM 307.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for controlling an electrically erasable programmable read only memory (EEPROM), the method comprising:
   generating a clock signal at a frequency suitable for operation of said EEPROM; and
   resetting said EEPROM via said generated clock signal and a hardware generated data signal without intervention from a central processing unit (CPU).

2. The method according to claim 1, wherein said resetting occurs via a virtual CPU.

3. The method according to claim 2, wherein said virtual CPU is integrated within a finite state machine.

4. The method according to claim 1, wherein said generating is controlled via a virtual CPU.

5. The method according to claim 1, wherein said generating is controlled via a finite state machine.

6. The method according to claim 1, wherein said resetting occurs via a finite state machine.

7. The method according to claim 1, wherein said generating of said clock signal occurs utilizing a frequency counter.

8. The method according to claim 7, wherein said frequency counter detects a signal frequency from a clock source having a higher frequency.

9. A system for controlling an EEPROM, the system comprising:
   one or more circuits for generating a clock signal suitable for operation of said EEPROM; and
   said one or more circuits resets said EEPROM via said generated clock signal and a hardware generated data signal, without intervention from a central processing unit (CPU).

10. The system according to claim 9, wherein said one or more circuits comprise a virtual central processing unit (VCPU), which is utilized for said resetting of said EEPROM.

11. The system according to claim 10, wherein said virtual CPU is integrated within a finite state machine.

12. The system according to claim 9, wherein said one or more circuits comprises a virtual CPU which controls said generation of said clock signal.

13. The system according to claim 9, wherein said one or more circuits comprises a finite state machine that controls said generation of said clock signal.

14. The system according to claim 9, wherein said one or more circuits comprises a finite state machine that controls said resetting of said EEPROM.

15. The system according to claim 9, wherein said one or more circuits comprises a frequency counter that is utilized for said generation of said clock signal.

16. The system according to claim 15, wherein said frequency counter detects a signal frequency from a clock source having a higher frequency.

17. A machine-readable storage having stored thereon, a computer program having at least one code section for resetting an EEPROM, the at least one code section being executable by a machine for causing the machine to perform steps comprising:
   generating a clock signal suitable for operation of said EEPROM; and
   resetting said EEPROM via said generated clock signal and a hardware generated data signal without intervention from a central processing unit (CPU).

18. The machine-readable storage according to claim 17, wherein said at least one code section comprises code for generating a reset condition utilizing a virtual central processing unit (VCPU).

19. The machine-readable storage according to claim 18, wherein said at least one code section comprises code for integrating said virtual CPU within a finite state machine.

20. The machine-readable storage according to claim 17, wherein said at least one code section comprises code for controlling said generating via a virtual CPU.

21. The machine-readable storage according to claim 17, wherein said at least one code section comprises code for said resetting occurs via a finite state machine.

22. The machine-readable storage according to claim 17, wherein said at least one code section comprises code for generating said clock signal utilizing a frequency counter.

23. The machine-readable storage according to claim 17, wherein said at least one code section comprises code for detecting a signal frequency from a clock source having a higher frequency.

* * * * *